United States Patent
Sanftleben et al.

Patent Number: 5,460,767
Date of Patent: Oct. 24, 1995

[54] HOT MELT MASKING MATERIALS

[75] Inventors: Henry M. Sanftleben, Carmel; James M. Rosson, Kokomo, both of Ind.

[73] Assignee: Delco Electronics Corporation, Kokomo, Ind.

[21] Appl. No.: 251,700

[22] Filed: May 31, 1994

[51] Int. Cl.⁶ .......................... B29C 65/52; B29C 65/40; B29C 39/10; B29C 39/12
[52] U.S. Cl. .................. 264/263; 264/272.17; 264/279; 264/261; 156/155; 156/292; 156/244.12; 156/244.22; 29/841; 427/96; 427/284; 427/264; 427/270
[58] Field of Search ..................... 156/145, 155, 156/244.12, 244.19, 244.22, 292; 264/261, 263, 252, 279.1, 279, 277, 272.11, 272.17; 427/96, 208.2, 271, 284, 264, 270; 118/669; 29/841

[56] References Cited

U.S. PATENT DOCUMENTS

| | | | |
|---|---|---|---|
| 4,278,707 | 7/1981 | Biran | 427/248 X |
| 5,232,758 | 8/1993 | Juskey et al. | 427/96 X |
| 5,246,730 | 9/1993 | Peirce et al. | 427/96 |
| 5,266,349 | 11/1993 | Bok | 427/96 X |

Primary Examiner—Michael W. Ball
Assistant Examiner—Francis J. Lorin
Attorney, Agent, or Firm—Mark A. Navarre

[57] ABSTRACT

A method is provided for processing an electronic circuit assembly having surface mount integrated circuit packages mounted to its substrate, in which ingress of a conformal coating into a void present between the IC package and the substrate is prevented by a masking composition which forms a barrier around the IC package prior to the conformal coating process. The masking compositions are hot melt materials, in that each is initially a solid at roughly room temperature, melts to become a liquid at an elevated temperature at which the masking composition is applied to the electronic assembly, and forms a solid upon cooling to a temperature corresponding to a service temperature of the electronic assembly. As such, the masking compositions can be rapidly applied through various highly controllable techniques, and will quickly and sufficiently solidify upon cooling to allow handling of the electronic assembly. The masking compositions may be nonreactive, indicating that the barrier can be remelted, or reactive, indicating that a post-application curing process occurs over time at a temperature less than the elevated application temperature.

10 Claims, 1 Drawing Sheet

HOT MELT MASKING MATERIALS

This patent application is related to co-pending U.S. patent application Ser. No. 08/248,043 to Sanftleben et al., and assigned to the same assignee of this patent application.

The present invention generally relates to processing techniques for electronic circuit assemblies which include surface mount integrated circuits. More particularly, this invention relates to electronic circuit assemblies which utilize a conformal coating for the purpose of providing protection from moisture and dirt and enabling surface mount integrated circuit devices to be more resistant to vibration and solder joint fatigue, in which a barrier is formed prior to the conformal coating process so as to prevent the conformal coating from flowing into a void formed between the circuit devices and the assembly's substrate.

BACKGROUND OF THE INVENTION

Electronic circuit assemblies are often required to be capable of surviving in hostile operating environments, such as those commonly found in the automotive and aerospace industries. Such assemblies often employ surface mount integrated circuit (IC) packages, which can generally be characterized as being electrically and mechanically attached to the substrate of the assembly with a number of leads that are soldered to both the IC package and conductors formed on the substrate. The solder joints are subject to thermal stresses as a result of temperature fluctuations in the assembly's working environment and differences in coefficients of thermal expansion of the various materials used in the construction of the electronic assembly. These thermal stresses can potentially cause irreversible damage to the solder joints.

The above is further aggravated by the use of a conformal coating, which is widely used in the electronics industry to form a protective barrier layer on the circuit board. Conformal coatings are generally formulated from polymeric materials of the silicone, acrylic, urethane and epoxy families, and serve to protect the electronic assembly from moisture and dirt, as well as make the IC packages mounted to the circuit board more resistant to vibration. However, the leads support the IC packages above the surface of the substrate, such that a void is present between surface mount IC packages and the substrate. Consequently, during the conformal coating process, there is a tendency for the conformal coating material to flow beneath the IC packages. As such, the conformal coating tends to bridge the gap between the IC packages and the substrate, which induces stresses that are particularly damaging due to the vast difference in coefficients of thermal expansion between the conformal coating material and the solder and lead materials. Stresses may also be induced as a result of the conformal coating material swelling in reaction to contact with a solvent. Additional factors which effect the solder joint stress include the conformal coating thickness, its bulk modulus of elasticity, the physical characteristics of the component and its leads, the size of the gap between the component and the board, and the coefficient of thermal expansion of the component and the board.

As a result of the above, the expected life of the solder joints may be significantly decreased, at times on the order of up to a 90 percent loss in expected life. Notably, current integrated circuit packaging trends are toward IC packages with lower standoffs and less compliant leads, therefore resulting in packages which even more prone to damage.

In the past, masking materials have been used to form a permanent, nonremovable barrier around the perimeter of surface mount IC packages in order to prevent the conformal coating from flowing between the package and the substrate. Ultraviolet-curing (UV-curing) and room temperature vulcanizing (RTV) silicones have been used for this purpose, but with certain significant disadvantages. For example, the cost of employing UV-curing silicones is relatively high, including the raw material costs, the cost of the UV-curing equipment, and the maintenance and operating costs of the equipment. RTV silicones are also relatively expensive, and are somewhat difficult to use in a continuous production line operating at levels necessary in the automotive industry. For example, as applied, RTV silicones require about three to about seven days to fully cure. At viscosities on the order of about 10,000 cps, RTV silicones tend to flow readily, such that they will rapidly bridge the gap between the IC package and the substrate. RTV silicones applied at higher viscosities, as high as 100,000 cps or more, are also likely to extrude between the leads and beneath the IC package if the dispensing nozzle contacts the leads. Additional disadvantages of RTV silicones include their poor compatibility with coating materials other than silicones, and the release of condensation reaction by-products, such as methanol, ethanol and acetone, which have maximum allowable exposure limits.

From the above, it can be seen that it would be desirable if a method were available which could prevent the ingress of a conformal coating material into the void between a surface mount IC package and the substrate of an electronic circuit assembly. More specifically, such a method would have minimal impact on the processing and costs of such electronic circuit assemblies, and would not require the use of a solvent so as to avoid the environmental and safety hazards associated with solvents.

SUMMARY OF THE INVENTION

It is an object of this invention to provide a method by which a conformal coating material applied to the surface of an electronic circuit assembly is prevented from ingressing between the assembly's substrate and a surface mount integrated circuit device mounted to the substrate.

It is another object of this invention that such a masking material be capable of being selectively and accurately applied in a manner which prevents the conformal coating from bridging the gap between the IC device and the substrate, while allowing sufficient coverage with the conformal coating.

It is yet another object of this invention that such a method entail a masking material which does not require the use of a solvent, so as to avoid the environmental and safety hazards associated with solvents.

It is a further object of this invention that such a masking material require minimal processing time, capital, floor space, labor and process inventory.

In accordance with a preferred embodiment of this invention, these and other objects and advantages are accomplished as follows.

According to the present invention, a method is provided for preventing ingress of a substance, and particularly a conformal coating, into a void created between a surface mount IC device and a substrate to which the IC device is attached. The method generally entails the use of a hot melt masking composition which is characterized by initially being a solid or semisolid at approximately room temperature, being a liquid at an elevated temperature at which said hot melt masking composition is applied on said substrate, and thereafter solidifying after a period of time. As such, the masking composition can be rapidly applied through various highly controllable techniques, and will quickly solidify over time or upon cooling to allow handling of the electronic assembly. A preferred aspect of this invention is that, once the conformal coating has solidified on the assembly substrate, the masking material can be readily removed.

The masking compositions of this invention are either nonreactive, indicating that the composition can be remelted after solidifying, or reactive, indicating that a curing process occurs over time at a temperature less than the elevated application temperature. As such, the masking compositions of this invention may be one of several types, which include non-curing thermoplastics materials, thermosetting materials which are capable of forming a solid coating through a secondary heat or moisture-activated cure, and mixtures of curable and non-curable polymeric materials.

In use, a hot melt masking composition of this invention is heated to a sufficient temperature, such as about 40° C. to about 250° C., so as to become liquified. A bead of the hot melt masking composition is then dispensed onto the substrate of the electronic circuit assembly at the perimeter of a surface mount IC package attached to the substrate. Because of the hot melt characteristic of the masking composition, conventional hot melt dispensing can be employed to accurately and rapidly form the bead. The bead is then allowed to cool in order to solidify the masking composition. Upon cooling, the masking composition may undergo a chemical reaction at room temperature or during a processing or testing operation in which heat is applied, such that cross-linking occurs to render the masking composition non-remeltable. In any event, solidification of the bead produces a physical barrier around the IC package, such that materials applied to the substrate are prevented from flowing into the void between the surface mount IC package and the substrate. Thereafter, a conformal coating can be applied to the circuit assembly without concern for the coating material bridging the gap between the IC package and the substrate. Preferably, the adhesion and mechanical properties of the masking material allow the masking material to be removed after the conformal coating has sufficiently cured. Generally, this invention also encompasses an electronic assembly produced by the method described above.

Preferred hot melt masking compositions of this invention are characterized by being applied as a liquid at an elevated temperature, and being a solid or semisolid (e.g., having a viscosity of 250,000 centipoise (cps) or more) at about –40° C. to about 125° C. The hot melt masking compositions are either fully reversible, resulting in a barrier which can be remelted by reheating to a sufficient elevated temperature, or reactive so as to chemically cross-link and become non-remeltable after a period of time at a reduced temperature, such as room temperature. The latter type of masking composition includes solid or semisolid two-component systems in which one of the two components is a liquid at room temperature prior to mixing.

With the hot melt masking compositions of this invention, it is possible to eliminate the presence of a conformal coating beneath a surface mount IC package, such that the potential service life of the package and its assembly are significantly promoted. Because hot melt dispensing methods can be used, hot melt equipment and systems currently used to apply adhesives in the packaging and container industries can be used to rapidly and selectively apply the masking compositions on the surface of the electronic assembly, requiring a process cycle time of as little as a few seconds.

Another advantage of this invention is that such masking compositions do not require the use of a solvent, such that the environmental and safety hazards associated with solvents and the emissions of volatile organic components (VOC) and ozone-depleting components (ODC) are completely avoided. Consequently, specialized equipment is not required to handle the masking compositions before and after the application process.

In addition, the use of the reactive masking compositions encompass the benefits of hot melt processing, yet include a secondary reaction for cross-linking the composition over a period of time at a reduced temperature, such as during storage, or at an elevated temperature attained during a subsequent processing or testing operation. Consequently, the advantages associated with cured polymer systems, such as stability and resistance to chemical attack, can be realized while retaining the advantages of hot melt dispensing methods. Furthermore, the masking compositions of this invention have the potential for being relatively inexpensive.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

The present invention provides method for processing an electronic circuit assembly having surface mount integrated circuit packages mounted to its substrate, in which ingress of a conformal coating into a void present between the IC package and the substrate is prevented by a masking composition which forms a barrier around the IC package prior to the conformal coating process. The masking compositions of this invention can all be characterized as hot melt materials, in that each is initially a solid at roughly room temperature, melts to become a liquid at an elevated temperature at which the masking composition is applied to the electronic assembly, and forms a solid upon cooling to a temperature corresponding to a service temperature of the electronic assembly. As such, the masking compositions can be rapidly applied through various highly controllable techniques, and will quickly and sufficiently solidify upon cooling to allow handling of the electronic assembly.

Figure 1:
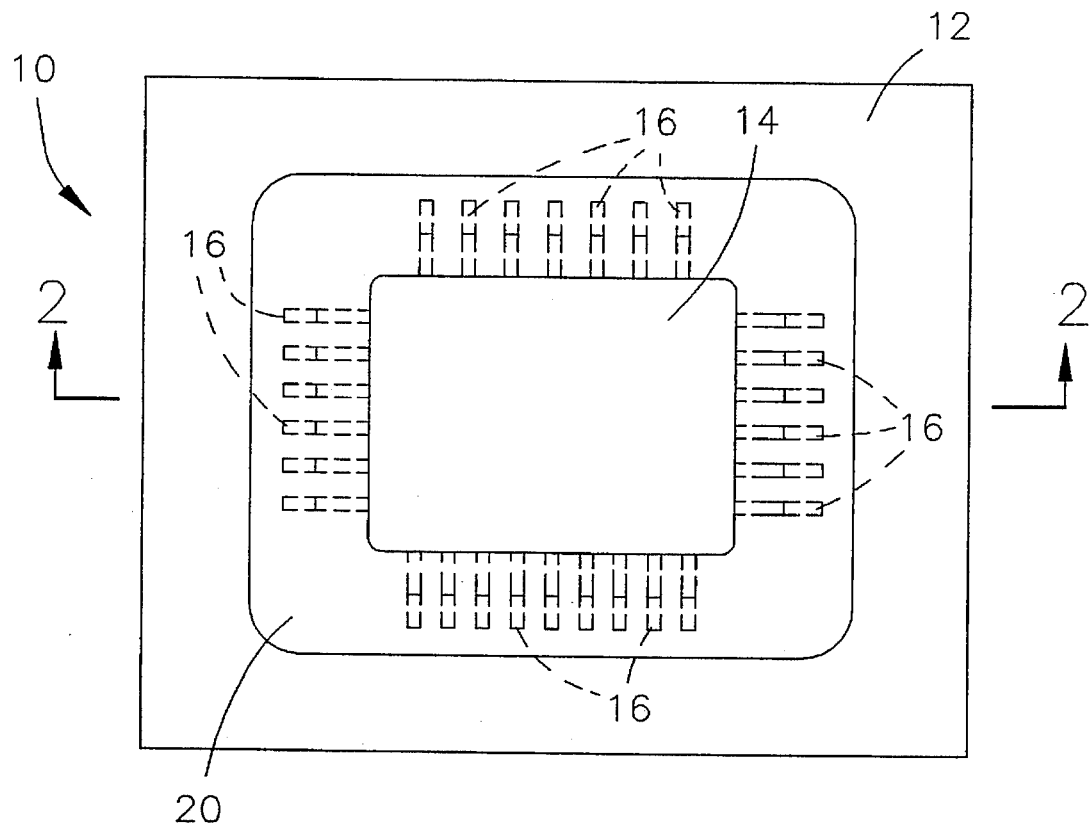
FIG. 1 is a plan view of a portion of an electronic circuit assembly having a surface mount integrated circuit package mounted thereon, in which a masking composition has been applied to the assembly to form a barrier around the perimeter of the IC package in accordance with this invention.
Figure 2:
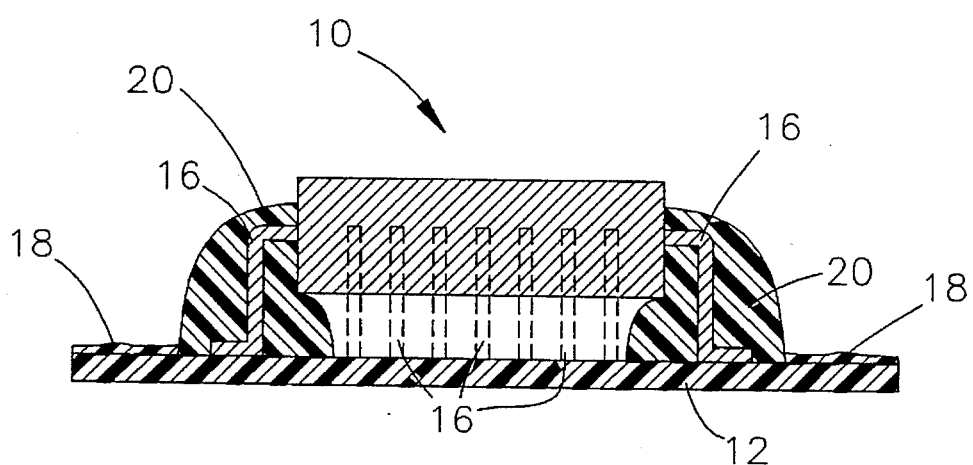
FIG. 2 is a cross-sectional view of the electronic circuit assembly of FIG. 1.

Referring to FIGS. 1 and 2, an electronic assembly 10 is represented which illustrates some of the general concepts of this invention. As shown, the electronic assembly 10 includes a circuit board 12 on which is supported a surface mount integrated circuit package 14. As is conventional, the package 14 is electrically connected to the circuitry of the electronic assembly 10 and secured to the circuit board 12 with a number of leads 16 that are joined with solder to conductors (not shown) present on the circuit board 12. As is conventional, the leads 16 support the package 14 above the surface of the circuit board 12 such that a gap is created therebetween. A conformal coating 18 is deposited on the circuit board 12. Generally, the conformal coating 18 is shown as being a thin film, generally on the order of about 0.05 to about 0.13 millimeters (about 0.002 to about 0.005 inch) in thickness, though it is foreseeable that greater or lesser thicknesses might be used.

The above-described electronic assembly 10 is merely intended to represent generally conventional circuit assemblies. Therefore, the teachings of this invention are not limited to the specific configuration shown in the Figure, and are equally applicable to electronic assemblies which utilize a ceramic substrate or a printed wiring board such as a polyimide, mylar, epoxy-glass or phenolic film, essentially any type and combination of circuit components which include surface mount technology (SMT) integrated circuit packages, and various techniques for securing and electrically connecting such packages to the assembly. Accordingly, those skilled in the art will recognize that numerous variations of the illustrated electronic assembly 10 are possible, all of which are within the scope of this invention.

As noted above, a key feature of this invention is that the masking compositions of this invention are deposited at the perimeter of the surface mount IC package 14 attached to the circuit board 12 so as to form a barrier 20 which prevents the subsequently applied conformal coating 18 from bridging the lower surface of the package 14 and the circuit board 12. The masking compositions are particularly formulated to be applied accurately using hot melt dispensing equipment currently available. As such, the masking compositions are hot melt materials, meaning that they are initially a solid or semisolid at approximately room temperature, a liquid at an elevated temperature at which the coating materials are applied to the electronic assembly 10, and solidify upon cooling to a temperature corresponding to a service temperature of the electronic assembly 10. Therefore, a significant advantage of this invention is that the masking compositions of this invention can be rapidly applied using hot melt equipment, and will solidify upon cooling without requiring an extended cure at an elevated temperature or removal of a solvent. In a preferred embodiment of this invention, the masking compositions are also formulated to be removable from the electronic assembly 10 after the conformal coating process, such that the barrier 20 will not effect the leads 16 and solder of the assembly 10 in service.

The specific characteristics desired of the masking compositions of this invention include the following. First, each coating material should initially be a solid or semisolid in order to allow loading into hot melt dispensing equipment. Secondly, the masking compositions must liquify and reach a viscosity of about 1000 to about 10,000 cps when at a dispensing temperature in the range of about 40° C. to about 250° C., though it is foreseeable that viscosities of up to about 50,000 cps may be acceptable, depending on the application method, the desired thickness of the coating, and the surface area to be covered. Most preferably, the masking compositions should have a work life of about three hours or more at the elevated dispensing temperature. Thirdly, the barrier formed by the masking composition is preferably semi-rigid or flexible, and should not be rigid or brittle upon cooling unless its coefficient of thermal expansion sufficiently matches that of the circuit board 12 to be coated. Fourthly, the masking composition should preferably be suitable for the intended application environment of the electronic assembly, which generally necessitates some degree of resistance to chemical attack and elevated temperatures.

In general, the hot melt masking compositions which have been determined to satisfy the above criteria are nonreactive, indicating that the system can be subsequently remelted, or reactive, which designates that a curing process occurs over time at a temperature less than the elevated dispensing temperature, and preferably at room temperature to allow curing during storage. The former type of composition is non-curing thermoplastic materials, while the latter type is a curable thermosetting material or a mixture of curable and non-curable materials that are capable of forming a solid coating through a secondary cure.

A preferred non-curing (and therefore nonreactive) thermoplastic material for use as the hot melt masking composition of this invention is polyolefin, and more preferably amorphous polyolefins (APO). In accordance with this invention, a suitable masking composition is blended to contain at least about 70 weight percent APO, with up to 30 weight percent epolene wax being included in order to alter the adhesion properties of the masking composition. In addition, masking compositions composed of about 40 to about 99 weight percent APO with modifiers such as paraffin wax, microcrystalline wax, polybutene, isobutene, antioxidants and/or other thermoplastic materials, have been found to be suitable. Polyolefins which have been modified in accordance with the above are characterized as being a solid or semisolid within the range of about −40° C. to about 125° C., and being a liquid at a temperature of about 200° C. or greater. As such, these compositions are suited for use as hot melt materials, and can be selectively applied at the perimeter of the package 14 with hot melt dispensing equipment as a liquid at an elevated temperature. Upon cooling to room temperature, these materials solidify and form the desired barrier 20. As noted above, the barrier 20 preferably can be peeled from the circuit board 12 after the conformal coating process.

If intended to remain on the electronic assembly 10, the masking composition must also be capable of surviving the working environment of the assembly 10. Under these circumstances, the anticipated service temperatures will influence the preferred formulation of the masking composition. The above nonreactive hot melt materials are suitable for many applications in which relatively low service temperatures (e.g., about 125° C. or less) are anticipated. In addition, these nonreactive hot melt materials can be applied very rapidly, which is advantageous for high volume manufacturing. However, nonreactive materials have a somewhat limited useful temperature range and limited solvent resistance. Consequently, hot melt materials which undergo a curing process via cross-linking, and therefore will not soften or melt at higher temperatures, are generally preferable for applications demanding a higher operating temperature range and/or improved solvent resistance. In accordance with this invention, the curing mechanism which accomplishes the cross-linking ideally takes place at moderate elevated temperatures attained during a subsequent processing or testing operation, or at room temperature. A requirement for cross-linking at elevated temperatures would seriously curtail the work life of the hot melt and require lengthy cures.

In accordance with this invention, preferred reactive hot melt masking compositions include systems which are capable of a secondary moisture cure, or are a multicomponent chemistry in which a nonreactive polymeric material is combined with a curable polymeric material. Moisture curing is a preferred method of cross-linking for the present invention, because moisture curing can occur at room temperature. Thus, energy otherwise expended for heat cures is saved, as well as capital expenditures for ovens and other equipment. In accordance with this invention, epoxies and urethanes are formulated to moisture-cure for this purpose. For example, epoxies are formulated to be moisture-curable via a ketimine reaction, in which moisture causes the ketimine to dissociate into polyamine and ketone. The ketone evaporates from the material and the polyamine reacts with the epoxy resin to form a network polymer. Another example is urethane which is formulated to be moisture-curable via an isocyanate moisture reaction, in which moisture causes the isocyanate to dissociate into a primary amine and carbon dioxide. The carbon dioxide leaves the material as a gas, while the primary amine rapidly reacts with free isocyanate to form a urea linkage. In addition, polyfunctional isocyanates moisture-cure to form network polymers. Isocyanate-terminated prepolymers are usually used for moisture cures.

The suitability of certain nonreactive and reactive coating materials outlined above was investigated through evaluations of different combinations of ingredients, with emphasis on processing, flexibility and stability characteristics of the resulting coating materials. The processing characteristics included viscosity and adhesion of the hot melt at elevated temperatures, while flexibility was determined by durometer testing and hand flexing.

Testing of the nonreactive class of coating materials focused on amorphous polyolefins. Amorphous polyolefins were selected on the basis of high process throughput capability, low glass transition temperature, mechanical properties which are comparable to elastomeric dimethyl silicone at temperatures of between about −40° C. and 125° C., equivalent electrical properties to silicone between about −40° C. and 150° C., low raw material costs, and their compatibility with various application methods used in the hot melt industry. Polyolefins also have the advantage of being very stable when melted, enabling them to be kept in a molten state at a suitable dispensing temperature (e.g., 160° C. to 230° C.) for extended periods of time. In contrast, thermoplastics such as polyamides tend to char at temperatures of about 5° C. to about 10° C. above their melting temperatures, which would severely limit their ability to achieve a usable viscosity for dispensing with hot melt equipment. A viscosity of at least about 1000 cps at the desired dispensing temperature was determined to be preferable. In addition, preferred characteristics identified for purposes of this invention included a glass transition temperature ($T_g$) of no more than about −30° C. above the lowest service or test temperature for the circuit assembly, and mechanical properties at about 25° C. including a hardness of about 30 shore 00 to 50 shore A, elongation of about 20 to about 300%, and a thermal coefficient of expansion of less than about 500 ppm/°C.

Generally, the amorphous polyolefins were formulated to have a glass transition temperature of no more than about 10° C.; a hardness on the Shore A scale (with a five second dwell) of about 15 to about 55 at room temperature, with a preferred range being about 15 to about 30; a ring and ball softening point (per ASTM E-28-67) of at least about 30° C. above the maximum service temperature of the circuit assembly, and a preferred viscosity of about 1200 cps at suitable application temperatures within the range of about 180° to about 210° C.

The hot melt polyolefin formulations identified in Table I were evaluated for purposes of this invention. Amorphous polyolefins generically include propylene homopolymers, propylene-ethylene copolymers, propylene-butene copolymers, propylene-hexene copolymers, propylene-butene-ethylene terpolymers, ethylene homopolymers, and blends containing one or more of the above polymers. The particular amorphous polyolefins evaluated for purposes of this invention were E1010 and P1023, which are both available from the Eastman Kodak Company under the trademark EASTOFLEX. E1010 is a propylene-ethylene copolymer, having a $T_g$ of about −24° C. and a ring and ball softening point of about 140° C., while P1023 is a propylene homopolymer having a $T_g$ of about −10° C. and a ring and ball softening point of about 155° C.

TABLE I

| Formulation | (in Parts) | |
| --- | --- | --- |
| | E1010 | P1023 |
| A | 100 | 0 |
| B | 100 | 70 |
| C | 100 | 55 |
| D | 100 | 30 |
| E | 100 | 11.5 |

The above formulations were evaluated for their glass transition temperature ($T_g$) per ASTM D3418, Shore A hardness per ASTM D2240 with a five second dwell. All were solid at room temperature, had glass transition temperatures of generally between about −10° C. and about −25° C. and had melting temperatures of about 135° C. to about 150° C. Generally, higher glass transition temperatures coupled with a hardness in excess of about 60 Shore A was deemed undesirable due to reduced adhesion characteristics and a tendency to delaminate at temperatures on the order of about 30° C. to about 50° C. below the glass transition temperature. Of the above formulations, Formulation A had the lowest adhesion characteristics, and tended to delaminate during a 1500 hour cold thermal cycling test between about −40° C. and about 85° C. Yet the ability to remove the barrier formed with each of the formulations can be desirable, as noted above, and each of these formulations was determined to be removable. Further evaluations determined that the ability to remove a barrier formed from the above formulations was promoted by additions of up to about 30 weight percent, and preferably between about 5 and about 15 weight percent of an epolene wax, such as those available from Eastman Kodak under the names N-14, N-15 and N-34. Notably, other additives could be used, including paraffin wax, microcrystalline wax, polybutene, isobutene, antioxidants, thermoplastic materials, or other modifiers known to those skilled in the art.

Of the above formulations, Formulation D was identified as generally exhibiting the most desirable characteristics in terms of its low glass transition temperature and the ease with which it can be removed. Formulation D exhibited a viscosity per ASTM D3236-88 of about 1400 to about 1600 cps at about 190° C. a ring and ball softening point per ASTM E28-67 of about 125° C. to about 165° C., a Shore A durometer reading per ASTM 2240-91 of about 20, and a maximum glass transition temperature per ASTM D3418-82 of about −20° C. Evaluations conducted to determine the application characteristics using a commercial hot melt dispensing system confirmed the suitability of the formulation as a hot melt masking composition for purposes of this invention.

The reactive class of masking compositions evaluated for purposes of this invention primarily involved epoxy and urethane-base systems, in which a suitable coating material was achieved by (1) mixtures of epoxy resins, at least one of which is solid or semisolid, or (2) curing using a moisture curing agent such as ketimine or low NCO isocyanates, or (3) a combination of the above. Various other methods exist by which curing can be achieved in the practice of this invention.

In the evaluation of mixtures of epoxy resins, liquid flexible resins were used to determine their ability to flexibilize solid epoxy resins, so as to yield a masking formulation which does not require the presence of a curative. Such an approach was adopted in that most solid epoxy resins are extremely brittle, and therefore are not suitable for forming the barrier 20. Additional benefits to blending liquid flexible resins with solid epoxy resins include lower application temperatures as a result of a liquid flexible resin having a lower viscosity at a given temperature, modifiable flow properties by altering the amount of solid epoxy resin and liquid flexible resin, and a general facilitation of processing.

The selection of the liquid flexible epoxy resins was based on three factors: (1) a sufficiently high viscosity to preserve solid phase characteristics of the solid resin, (2) hydrolytic stability, and (3) the ability to impart flexibility to the solid resin. The solid epoxy resins evaluated were a bisphenol-A type resin available from Dow Chemical Company under the name DER 661, a bisphenol-A type resin available from Shell Chemical under the name Epon 1004F, and a novolac type resin available from Shell Chemical under the name Epi-Rez SU8. The liquid flexible resins were a polyglycidyl ether of poly-(oxypropylene) polyol available from Shell Chemical under the name Heloxy 84, and a diglycidyl ether of poly-(oxypropylene) available from Dow Chemical under the name DER 732. The more suitable formulations resulting from this investigation are indicated in Table II.

TABLE II

| | Solid | wt % | Flexible | wt % | Compat. | State |
|---|---|---|---|---|---|---|
| A | DER 661 | 80 | DER 732 | 20 | good | 3.8 |
| B | " | 70 | " | 30 | good | 2.8 |
| C | " | 60 | " | 40 | good | 2.0 |
| D | " | 80 | Heloxy 84 | 20 | good | 4.1 |
| E | " | 70 | " | 30 | good | 3.4 |
| F | " | 60 | " | 40 | good | 2.9 |
| G | 1004F | 80 | DER 732 | 20 | good | 4.5 |
| H | " | 70 | " | 30 | good | 3.5 |
| I | " | 60 | " | 40 | good | 3.0 |
| J | " | 80 | Heloxy 84 | 20 | good | 4.8 |
| K | " | 70 | " | 30 | good | 4.0 |
| L | " | 60 | " | 40 | good | 3.0 |
| M | SU8 | 80 | DER 732 | 20 | good | 4.0 |
| N | " | 70 | " | 30 | good | 3.2 |
| O | " | 60 | " | 40 | good | 2.8 |
| O | " | 50 | " | 50 | good | 2.0 |

Rating Definitions:

Compatibility:
good = Produces clear solution when mixed with no separation or phasing of the components over time.

Physical State:

1 = A flowable liquid with a melting point well below room temperature; Viscosity on the order of about 50,000 cps or less.
2 = A slow-flowing liquid, melting point is slightly below room temperature; Viscosity on the order of about 50,000 to 500,000 cps.
3 = A semisolid material; Tacky and easily deformed at room temperature, but will self-level over hours or days; Melting point is slightly at or near room temperature; Viscosity on the order of about 500,000 to TABLE II-continued

| Solid | wt % | Flexible | wt % | Compat. | State |
|---|---|---|---|---|---|

5,000,000 cps :
4 = A plastic solid; Has little or no tack at ambient, but can be deformed with some effort; Melting point is above room temperature; Viscosity above about 5,000,000 cps.
5 = A rigid solid; Brittle and may be fractured at room temperature, Melting point is well above room temperature.

From the evaluations represented above, it was determined that Heloxy 84 was incompatible to varying degrees with the solid epoxy resins as evidenced by exudation, while DER 732 was found to be more compatible. The solid epoxy resins exhibited a higher tolerance of liquid flexible resins while retaining a solid state in the following order: Epi-Rez SU8, Epon 1004F and DER 661. It was concluded from the above trials that the solid epoxy resins should be selected with as high a melting temperature as possible so that the addition of the liquid flexible resin would not liquify the entire mixture at room temperature, a state incompatible with hot melt dispensing techniques. In addition, from the standpoint of surface tack, state ratings of about 3.4 or more were considered to be suitable, reflecting a lower level of surface tack which otherwise has an adverse effect the ability to handle a substrate after coating. Generally, it is believed that the addition of a phenolic resin to the above formulations would reduce tackiness, in that they act as accelerators for many epoxy curatives.

Overall, the above formulations indicated that a reactive hot melt epoxy masking composition could be flexibilized by mixing with liquid flexible resins. Accordingly, with the addition of a suitable curative, it was concluded that these formulations could yield a cured, relatively flexible barrier with the recognition that the curable reactive resin component of each formulation would dominate the noncurable liquid flexible resin component of each formulation. Notably, the addition of liquid flexible resins was also beneficial in lowering the melting temperature of the solid epoxy resins. Furthermore, the addition of liquid flexible resins can be expected to accelerate moisture curing by increased molecular motion and higher moisture permeability.

Evaluations were then performed with epoxies formulated to contain a ketimine curative to effect a moisture cure. As is known in the art, ketimines react with epoxy resins at a practical rate of cure under ambient conditions, in which atmospheric moisture is absorbed during and after application to serve as a source of water required to activate the curing agent and thereby form a polyamine and ketone. The ketimine curatives used were several available from the Shell Chemical Company, identified as H-1, H-2 and H-3. Moisture-curable urethanes were also formulated with unreacted isocyanate groups. Accordingly, isocyanate-terminated prepolymers of polymeric diols and triols were favored, especially those having a low % NCO content which will react with moisture to form an amine, which then will react with an epoxy or isocyanate. Generally, the above polymer systems are liquids at room temperature prior to curing. Therefore, these polymer systems must be solidified to some degree in order to be appropriately loaded into conventional hot melt equipment.

Reactive hot melt epoxy compositions were formulated using the H-1 and H-3 ketimine moisture curing agents noted previously. Moisture-curing techniques were pursued in that their use is highly energy efficient, and eliminates the requirement for curing ovens or the like to effect post cures.

The various epoxy resins tested included DER 661, DER 732, Epi-Rez SU8 and Heloxy 84, as described above, in addition to bisphenol-A type resins available from Dow Chemical under the names Epon 164, Epon 828, Epon 1001, and Epon 2002, novolac type resins DEN 431, DEN 438 and DEN 444 available from Dow Chemical, NC-547 available from Cardolite, and other solid multifunctional resins such as HPT 1071 available from Shell Chemical and MT-0163 available from the Ciba-Geigy Corporation. Heloxy 67 and Heloxy 505, both available from Shell Chemical, and NC-514, available from Cardolite, were included as diluents and modifiers.

Results of the epoxy-base hot melt masking compositions are indicated in Tables III and IV. Moisture cure characteristics and resistance to acetone as an indication of network polymer formation are noted for the formulations of Table III.

TABLE III

| Resin | RT State | phr H-1 | Cure Time | Comment |
|---|---|---|---|---|
| Epon 828 | liquid | 27.4 | ≈7 days | Insoluble solid |
| DER 661 | solid | 9.9 | >14 days | Soluble solid |
| NC-514 | liquid | 14.9 | 4–7 days | Swellable rubber |
| NC-547 | liquid | 8.7 | 2–4 days | Swellable rubber |
| DEN 438 | semisolid | 29.2 | 7–10 days | Insoluble solid |
| SU8 | solid | 25.7 | N/A | Unable to mix |
| HPT 1071 | solid | 32.5 | 7–14 days | Insoluble solid |
| MT 0163 | solid | 27.1 | 7–14 days | Insoluble solid |
| DER 732 | liquid | 16.3 | 2–3 days | Swellable rubber |
| Heloxy 67 | liquid | 40.0 | 2–3 days | Swellable rubber |
| Heloxy 84 | liquid | 8.0 | 7–10 days | Swellable rubber |
| Heloxy 505 | liquid | 8.7 | 2–3 days | Swellable rubber |

TABLE IV

| Resin | RT State | phr H-3 | Comment |
|---|---|---|---|
| DEN 431 | liquid | 57.71 | Partially cured in 4 hours |
| DEN 444 | semisolid | 48.10 | No tack at room temperature |
| NC-547 | liquid | 16.83 | Partially cured in 4 hours |
| Epon 164 | semisolid | 45.91 | No tack at room temperature |
| Epon 1001 | solid | 18.70 | Little cure after 24 hours |
| Epon 2002 | solid | 14.03 | Little cure after 24 hours |

Generally, the DEN 431, DEN 444 and NC-547 novolacs cured much faster with the H-3 ketimine curative than did the Epon 164, Epon 1001 and Epon 2002 bisphenol-A type resins. The Epon 1001 and 2002 epoxies exhibited little or no curing after 24 hours at room temperature, while the remaining formulations exhibited a cured and irreversible condition. From this investigation, it was concluded that increased flexibility assists the moisture curing process, in that formulations which are not brittle tended to moisture cure more readily.

The formulations of Tables III and IV were deemed to be base reactive masking compositions. For example, foreseeable refinements to the formulations of Table IV would be to reduce tackiness through the inclusion of a phenolic resin, or to enhance flexibility with a flexibilized epoxy resin, or to mix various epoxies to combine their individual desirable properties within a single formulation. In addition, the liquid systems would require a filler in order to be suitable as a masking composition. Based on the above and the findings of Tables III and IV, a modified composition having particularly desirable adhesion and processing properties was formulated to be composed of about 5.5 parts DEN 431, about 40 parts NC-547, about 10.5 parts Epon 1001, about 40 parts DEN 444, and about 33.15 parts H-3 as a hardener. The resulting masking composition exhibited suitable physical properties by being a very flexible solid to semi-solid system which was capable of curing to a depth of about six millimeters within about one week. It is believed that the adhesive properties of this composition could be tailored by adding some non-reactive hot melt materials, but at the expense of effecting a formulations heat resistance or softening point, or reducing its solvent resistance. It is also believed that reworkability could be improved by adding a non-reactive ingredient, such as ethyl acrylate, methyl acrylate, or an acrylic acid polymer, though doing so would reduce the alkaline resistance of the materials.

Compositions of reactive hot melt urethanes were formulated based on the isocyanate-terminated prepolymer (ITP), which is capable of moisture-curing with no other ingredient present. However, most of these ITPs are liquid at room temperature, which is incompatible with hot melt processes. Accordingly, one approach was to mix ethylene vinyl acetate (EVA), which is a solid at room temperature, into the formulations to yield a room temperature solid. A second approach was to synthesize an ITP which solidified at room temperature, using two moles of DDI-1410, a diisocyanate available from Dow Chemical, and one mole of dried 1,4-butane diol. Mixing these constituents at room temperature started a reaction which heated the mass to about 70° C. The ITP formed was a wax-like solid upon cooling, with a melting temperature of about 50° C. to about 75° C. and calculated free NCO of about six percent.

Two formulations were than prepared, Sample A using the synthesized DDI-1410 prepolymer, and Sample B using about 50 parts of the DDI-1410 prepolymer and about 50 parts EVA mixed at about 125° C. Sample A was generally a waxy solid having a melting temperature of about 50° C. to about 75° C. and, after curing, was tough and flexible. As such, Sample A yielded a permanent barrier. Sample B was also generally a waxy solid having a melting temperature of about 100° C. which, even after curing, remained a waxy solid. Yet, Sample B yielded a barrier which could be more readily removed than the barrier formed with Sample A. Generally, the above urethane reactive hot melt compositions exhibited much faster moisture-cures than the reactive epoxy compositions, possible due to the higher reactivity of the isocyanate/amine reaction as compared to the epoxy/amine reaction.

Finally, the effect of fillers added to reactive hot melt compositions of this invention was evaluated to develop information concerning the solidification of marginally liquid materials and eliminating tackiness, the effect of which might yield formulations having lower melting temperatures. Fillers may also promote the compatibility of otherwise incompatible ingredients, so as to broaden the number of possible formulations.

Three reactive formulations were prepared using the bisphenol-A type epoxy resin Epon 1004F, the liquid flexible epoxy resins Heloxy 84 and DER 732, and/or the moisture curing agent ketimine H-3, all of which are described above. A fourth reactive formulation was prepared using a urethane available from Air Products as Airthane PET 73A. In addition, the formulations included possible additions of a polyol available from Union Carbide as LHT-34, a fumed silica available from Degussa as Aer-O-Sil R972, and 325 mesh alumina powder. LHT-34 was used to enhance the flexibility of the epoxy systems. The formulations were as follows.

TABLE V

| Ingredient | Parts Added | | | |
|---|---|---|---|---|
| | A | B | C | D |
| Epon 1004F | 70 | 55 | 22 | — |
| Heloxy 84 | 25 | 45 | — | — |
| PET 73A | — | — | — | 25 |
| DER 732 | — | — | 12 | — |
| LHT-34 polyol | 5 | 5 | — | — |
| R972 | — | — | 2.5 | — |
| Ketimine H-3 | 12 | 12.6 | 6.3 | — |
| $Al_2O_3$ powder | 300 | 300 | 63.5 | 75 |

All of the above formulations were removable for several days after cooling, and became permanently set thereafter, exhibiting a relatively low coefficient of thermal expansion on the order of about 30 to about 60 ppm/°C. The Sample A formulation exhibited a melting temperature of about 100° C. and, after curing, was very hard with an oily surface. The Sample B formulation exhibited a melting temperature of about 90° C. and, after curing, was also hard with an oily surface. Sample C had a melting temperature of about 90° C. with a suitable wetting capability. After curing, Sample C was a semi-hard plastic. Finally, Sample D was a solid at room temperature which, once melted, remained a liquid until sufficiently chilled. This formulation was a viscous liquid which moisture cured to an elastomeric state very quickly.

Generally, the above reactive hot melt formulations appeared to exhibit several advantages over the unfilled reactive hot melt formulations discussed previously. For example, the epoxy resins were more readily able to be formulated together, and lower melting temperatures were possible while maintaining a solid uncured physical state. The filled reactive hot melt formulations also appeared to be able to retain heat better when applied to a relatively cold substrate. In addition, each of the above formulations had relatively low coefficients of thermal expansion, on the order of about 20 to 40 ppm/°C., and remained removable for several days, though eventually becoming permanently adhered to their substrates.

From the above, those skilled in the art will appreciate that the present invention demonstrates the ability to formulate masking compositions which are initially a solid or semisolid at room temperature, are a liquid at an elevated temperature at which the masking compositions can be applied to an electronic assembly, and which solidify upon cooling to a service temperature of the electronic assembly to form a protective barrier at the perimeter of an IC package. As such, the masking compositions of this invention can be characterized as hot melt compositions, can be rapidly applied using commercially-available hot melt dispensing equipment, and then quickly solidified by cooling to room temperature or through curing during a subsequent processing or testing operation. Accordingly, significant advantages of the masking compositions of this invention include their ability to be selectively and accurately deposited at the perimeter of an IC package attached to an electronic assembly's substrate or circuit board, and their ability to allow the electronic assembly be handled soon after deposition.

The specific advantages of the masking compositions of this invention are determined by their status as being nonreactive or nonreactive. Nonreactive hot melt masking compositions of this invention are characterized by their ability to be remelted, and being a solid or semisolid within the range of about −40° C. to about 125° C. and a liquid at a temperature of about 200° C. or greater. In contrast, the reactive hot melt masking compositions of this invention are characterized by their ability to cure over time at a temperature less than the elevated application temperature, and may be mixtures of curable and non-curable thermoplastic and/or thermosetting materials which are capable of forming a solid barrier through a secondary heat or moisture-activated cure.

In use, this invention also encompasses a method for forming a barrier around a surface mount IC package of an electronic assembly. Generally, the application method made possible by this invention entails formulating the hot melt masking composition to be a solid at room temperature to allow its use with commercially-available hot melt dispensing equipment. Consequently, the hot melt masking compositions must also be capable of being a liquid at an elevated temperature of about 40° C. to 60° C. or greater, corresponding to temperatures at which the composition is dispensed and deposited on the electronic assembly using hot melt equipment. Such equipment allow the masking compositions of this invention to be deposited using various application techniques known to those skilled in the art. The deposited masking composition is then allowed to cool so as to solidify and form the desired barrier for the purpose of preventing a subsequently applied conformal coating from flowing between an IC package and the substrate. In accordance with this invention, the masking composition may be fully reversible upon cooling so as to enable remelting by reheating to the elevated temperature, or the masking composition may be reactive so as to chemically cross-link and become non-remeltable after a period of time at room temperature. With either type of formulation, a desirable characteristic made possible by some of the masking compositions of this invention is that the barrier can be removed after the conformal coating process.

Using the hot melt masking compositions of this invention, it is possible to greatly increase the production rate of electronic assemblies, which are generally limited by cure schedules. Because hot melt materials are dispensed using hot melt equipment and systems currently used to apply adhesives in the packaging and container industries, the desired barriers can be formed rapidly and selectively on the surface of an electronic assembly, reducing process cycle time to a few seconds. The masking compositions are also capable of being formulated such that their viscosity at the elevated dispensing temperature enables them to be applied without flowing beneath the IC packages.

Another advantage of this invention is that such masking compositions do not require the use of a solvent, such that the environmental and safety hazards associated with solvents and VOC and ODC emissions are completely avoided. Consequently, considerable savings are possible in that specialized equipment is not required to handle the compositions before and after the coating process. In addition, use of the reactive masking compositions of this invention simultaneously encompass the benefits of hot melt processing and the advantages of a thermoset material. Consequently, the advantages associated with cured polymer systems, such as stability and resistance to chemical attack, are realized while retaining the advantages of hot melt deposition methods. Finally, the masking compositions of this invention have the potential for being relatively inexpensive.

While our invention has been described in terms of a preferred embodiment, it is apparent that other forms could be adopted by one skilled in the art; for example, by substituting appropriate materials which achieve the desired characteristics of the nonreactive and reactive hot melt conformal coating compositions of this invention. Such materials may include commercially available hot melt materials, such as polyamides, urethanes, EVAs, styrene rubber block copolymers, if modified such that their glass transition temperatures are sufficiently low, their softening temperatures are sufficiently high, and their electrical properties, hardness and coefficients of thermal expansion are each within an acceptable range. Accordingly, the scope of our invention is to be limited only by the following claims.

The embodiments of the invention in which an exclusive property or privilege is claimed are defined as follows:

1. A method for preventing ingress of a substance into a void between a surface mount integrated circuit device and a substrate to which said surface mount integrated circuit device is attached, said method comprising the steps of:

providing a hot melt masking composition which is characterized by initially being a solid or semisolid at approximately room temperature, being a liquid at an elevated temperature at which said hot melt masking composition is applied on said substrate, and thereafter solidifying after a duration of time;

heating said hot melt masking composition so as to liquify said hot melt masking composition;

dispensing a bead of said hot melt masking composition onto said substrate at the perimeter of said surface mount integrated circuit device; and cooling said bead such that said bead solidifies to form a barrier which prevents ingress of a substance into said void between said surface mount integrated circuit device and said substrate.

2. A method as recited in claim 1 wherein said hot melt masking composition is fully reversible so as to enable remelting of said removable barrier upon reheating to said elevated temperature.

3. A method as recited in claim 2 wherein said hot melt masking composition has a glass transition temperature below about $-10°$ C. and mechanical properties at about $25°$ C. including a hardness of about 30 shore 00 to 50 shore A, elongation of about 20 to about 300%, and a thermal coefficient of expansion of less than about 500 ppm/$°$C.

4. A method as recited in claim 2 wherein said hot melt masking composition consists essentially of about 70 to about 100 weight percent amorphous polyolefin, with the balance being an epolene wax.

5. A method as recited in claim 2 wherein said hot melt masking composition consists essentially of about 40 to about 99 weight percent amorphous polyolefin, with the balance one or more components selected from the group consisting of paraffin wax, microcrystalline wax, polybutene, isobutene, antioxidants and thermoplastic materials.

6. A method as recited in claim 1 wherein said hot melt masking composition is reactive so as to chemically crosslink and become non-remeltable after a period of time.

7. A method as recited in claim 6 wherein said hot melt masking composition consists essentially of a reactive epoxy hot melt system.

8. A method as recited in claim 7 wherein said hot melt masking composition comprises a moisture curing agent selected from the group consisting of ketimine and isocyanate-terminated prepolymers of polymeric diols and triols having a low % NCO content.

9. A method as recited in claim 7 wherein said hot melt masking composition is formulated to comprise two components that react.

10. A method as recited in claim 1 further comprising the steps of:

applying a conformal coating to said substrate; and
    removing said barrier from said substrate.

\* \* \* \* \*